(12) United States Patent
Ryu et al.

(10) Patent No.: US 7,678,621 B2
(45) Date of Patent: Mar. 16, 2010

(54) CRYSTALLIZATION PATTERN AND METHOD FOR CRYSTALLIZING AMORPHOUS SILICON USING THE SAME

(75) Inventors: Myung Kwan Ryu, Kyoungki-do (KR); Eok Su Kim, Seoul (KR); Kyoung Seok Son, Seoul (KR); Jang Soon Im, Kyoungki-do (KR)

(73) Assignee: Hydis Technologies, Co., Ltd, Gyeonggi-Do (KR)

( * ) Notice: Subject to any disclaimer, the term of this patent is extended or adjusted under 35 U.S.C. 154(b) by 0 days.

(21) Appl. No.: 11/725,123

(22) Filed: Mar. 16, 2007

(65) Prior Publication Data

US 2007/0218658 A1    Sep. 20, 2007

(30) Foreign Application Priority Data

Mar. 17, 2006    (KR)    .............. 10-2006-0025042

(51) Int. Cl.
*H01L 21/00* (2006.01)
*H01L 21/84* (2006.01)

(52) U.S. Cl. .............. 438/149; 438/166; 438/487; 257/66; 257/75; 257/E21.379; 257/E21.134

(58) Field of Classification Search .............. 438/149, 438/150, 151, 166, 164; 257/459, 99, 100, 257/E21.134, 66, 49, 70, 75, E21.379
See application file for complete search history.

(56) References Cited

U.S. PATENT DOCUMENTS

| | | | | |
|---|---|---|---|---|
| 4,933,298 A | * | 6/1990 | Hasegawa | 438/150 |
| 2005/0176189 A1 | * | 8/2005 | Cho | 438/166 |
| 2006/0024858 A1 | * | 2/2006 | Kumomi et al. | 438/89 |

* cited by examiner

*Primary Examiner*—W. David Coleman
*Assistant Examiner*—Shaka Scarlett

(57) ABSTRACT

Disclosed are a crystallization pattern, and a method for crystallizing amorphous silicon. The method includes the steps of forming an amorphous silicon film on a glass substrate, forming a crystallization pattern by patterning the amorphous silicon film, and crystallizing the crystallization pattern into polycrystalline silicon by irradiating a laser onto the crystallization pattern. The crystallization pattern includes a peripheral region located within a first distance from an edge of the crystallization pattern, and an internal region located away from the edge of the crystallization pattern by more than the first distance. The internal region is divided into at least one sub-region, each sub-region includes one crystallization inducement pattern, and an edge of each sub-region is located within a second distance from the crystallization inducement pattern.

10 Claims, 5 Drawing Sheets

30

CRYSTALLIZATION PATTERN AND METHOD FOR CRYSTALLIZING AMORPHOUS SILICON USING THE SAME

BACKGROUND OF THE INVENTION

1. Field of the Invention

The present invention relates to a method for manufacturing a liquid crystal display device. More particularly, the present invention relates to a crystallization pattern for forming a multi-crystalline silicon thin film transistor and a method for crystallizing amorphous silicon using the same.

2. Description of the Prior Art

As generally known in the art, a thin film transistor (TFT), which is used as a switching device in a liquid crystal display device, is the most important part for performance of the liquid crystal display device. Herein, mobility or current leakage, which is the basis for determining performance of the TFT, significantly relates to a state or a structure of an active layer, which is a movement path of a charge carrier. That is, the mobility or current leakage may vary depending on the state or the structure of a silicon thin film forming the active layer.

In the case of a liquid crystal display device, which is currently used in the field, an active layer of a TFT mainly includes amorphous silicon (a-Si). However, an a-Si TFT including the active layer made of a-Si represents low mobility of about 0.5 $cm^2/Vs$, so there are limitations in fabricating all switching devices used in the liquid crystal display device by using the a-Si TFT. That is, a driving device used for driving a peripheral circuit of the liquid crystal display device must operate at a high speed, but the a-Si TFT cannot satisfy the operational speed required for the driving device for the peripheral circuit. Thus, the a-Si TFT is not suitable for realizing the driving device for the peripheral circuit.

In contrast, a polycrystalline silicon (poly-Si) TFT including an active layer made of poly-Si represents high mobility of about several tens to hundreds of $cm^2/Vs$, so the poly-Si TFT can be operated at a high speed suitable for the driving device for the peripheral circuit. For this reason, if a poly-Si layer is formed on a glass substrate, it is possible to easily provide a pixel switching device in addition to driving parts for the peripheral circuit.

The poly-Si thin film cannot be directly formed on the glass substrate. Thus, it is necessary to crystallize a-Si in order to form the poly-Si thin film on the glass substrate. In order to crystallize a-Si, there have been suggested an excimer laser annealing (ELA) scheme using a laser, and sequential lateral solidification (SLS) scheme for sequentially irradiating a patterned laser onto a substrate being moved. Such ELA and SLS schemes have been successfully commercialized.

According to the ELA scheme, a laser having low energy causing partial melting is repeatedly irradiated onto a substrate while the substrate is being moved in such a manner that 90% of the laser can be overlapped on the substrate, thereby obtaining a poly-Si thin film. However, since the ELA scheme is performed while repeatedly irradiating the laser onto the same location about 10 to 20 times, productivity is significantly lowered. In addition, since the maintenance period for laser equipment is short, the maintenance cost thereof may increase.

According to the SLS scheme, a laser is irradiated onto an a-Si thin film through a mask formed with a slit pattern, thereby completely melting the a-Si thin film in such a manner that the lateral growth may occur from both boundary lines of the solid phase and the liquid phase. Such a lateral growth continuously occurs when the laser is repeatedly irradiated, so that a poly-Si thin film having large-size grains can be obtained. In the case of the SLS scheme, in particular, in the case of a 2-shot SLS scheme, which has been commercialized, it is sufficient if laser irradiation is performed with respect to the a-Si thin film by two times, so the SLS scheme has a process window larger than that of the ELA scheme. In addition, the SLS scheme can obtain small-size grains having high quality corresponding to single crystal, so the SLS scheme is variously used.

However, when crystallizing a-SI through the SLS scheme, the characteristic of the TFT may be changed depending on the position and number of grain boundaries included in a TFT channel. In particular, in view of an array substrate, TFT characteristics may be irregular depending on pixels.

Therefore, it is very important to obtain uniform TFT characteristics when employing the SLS scheme. In order to solve this problem, there have been suggested various conventional schemes, such as a tilted SLS scheme, a pixel mixing scheme, a scheme using a bending type gate, a scheme for irradiating the laser on a-Si after forming a metal pattern having a reflection characteristic on the a-Si thin film (Korean Patent Application No. 1996-080083), and a scheme for irradiating the laser on a-Si after forming an anti-reflection layer pattern, such as an insulating layer, on the a-Si thin film (Korean Patent Application No. 1996-050488).

Although it is not illustrated or described in detail, as generally known in the art, the tilted SLS scheme can solve ununiformity of the TFT characteristics derived from the grain boundaries by varying the tilt angle. However, if the tilt angle is too large, a non-crystallized region may exist, thereby lowering the efficiency of the crystallization process. In addition, in the case of the pixel mixing scheme, productivity is reduced and the process is complicated as the mixing degree is increased.

In the case of the scheme using the bending type gate, which is under discussion, a wasted space may exist due to the structure of the bending type gate, so that the aperture of a pixel section may be reduced, space utility at a peripheral circuit may be lowered, and a design of the bending type gate may be complicated.

In addition, in the case of the scheme using the metal pattern, the metal may cause contamination. In the case of the scheme using the pattern, such as the metal pattern and the anti-reflection layer pattern, it is difficult to deal with devices having various sizes. In particular, in the case of the crystallization scheme using the pattern, the crystallization process proceeds from an outer lateral side of an a-Si pattern toward an internal region of the a-Si pattern, so that poly-Si having large-size grains is grown in a region located within a predetermined distance from the outer lateral side of the pattern, and poly-Si having small-size grains is grown in a region located away from the outer lateral side of the pattern by more than the predetermined distance, thereby causing irregular poly-Si. Thus, this scheme also represents limitations in use.

SUMMARY OF THE INVENTION

Accordingly, the present invention has been made to solve the above-mentioned problem occurring in the prior art, and an object of the present invention is to provide a crystallization pattern capable of forming poly-Si having large-size grains over the whole area thereof.

Another object of the present invention is to provide a method for crystallizing a-Si using a crystallization pattern, which can form poly-Si having large-size grains over the whole area thereof, thereby improving TFT characteristics.

Still another object of the present invention is to provide a method for crystallizing a-Si using a crystallization pattern, capable of improving productivity.

In order to accomplish these objects, according to one aspect of the present invention, there is provided a crystallization pattern including amorphous silicon, which is crystallized into polycrystalline silicon as a laser is irradiated thereto, the crystallization pattern comprising: a peripheral region located within a first distance from an edge of the crystallization pattern; and an internal region located away from the edge of the crystallization pattern by more than the first distance, wherein the internal region is divided into at least one sub-region, each sub-region includes one crystallization inducement pattern, and an edge of each sub-region is located within a second distance from the crystallization inducement pattern.

According to the preferred embodiment of the present invention, the first distance corresponds to a critical lateral growth length.

The second distance is identical to or shorter than the first distance.

The crystallization inducement pattern includes a hole pattern or a dimple pattern.

According to another aspect of the present invention, there is provided a method for crystallizing amorphous silicon in order to fabricate a polycrystalline silicon thin film transistor, the method comprising the steps of: forming an amorphous silicon film on a glass substrate; forming a crystallization pattern by patterning the amorphous silicon film in a form of an active pattern of the thin film transistor; and crystallizing the crystallization pattern into polycrystalline silicon by irradiating a laser onto the crystallization pattern, wherein the crystallization pattern includes a peripheral region located within a first distance from an edge of the crystallization pattern, and an internal region located away from the edge of the crystallization pattern by more than the first distance, the internal region is divided into at least one sub-region, each sub-region includes one crystallization inducement pattern, and an edge of each sub-region is located within a second distance from the crystallization inducement pattern.

According to the preferred embodiment of the present invention, the first distance corresponds to a critical lateral growth length.

The second distance is identical to or shorter than the first distance.

The crystallization inducement pattern includes a hole pattern or a dimple pattern.

The laser is irradiated onto the crystallization pattern through an SLS (sequential lateral solidification) scheme. When the laser is irradiated through the SLS scheme, a box type mask is used so as to expose an entire area of the crystallization pattern. Laser irradiation is performed only one time by using the box type mask.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
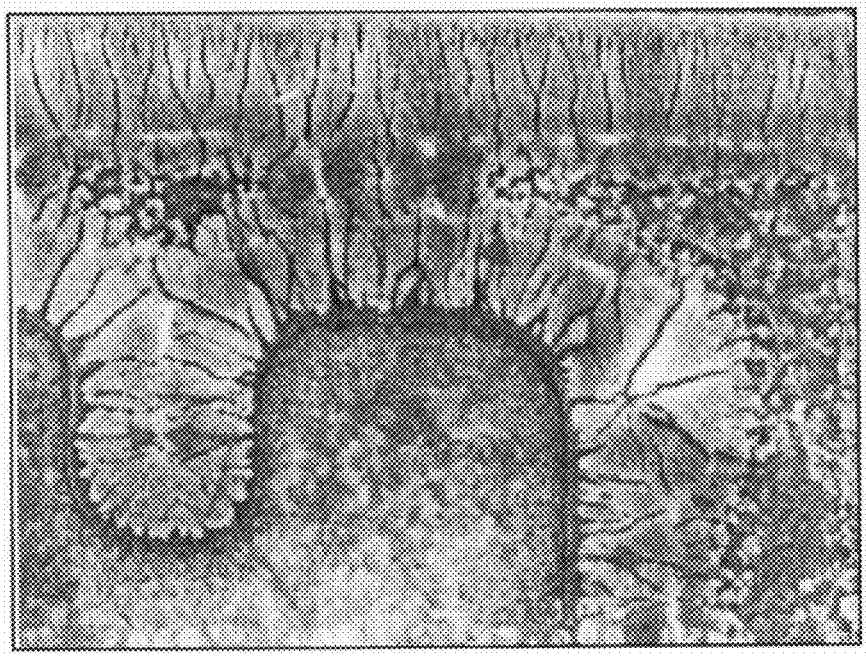
FIG. 1 is an SEM picture showing a fine crystallization structure obtained after a laser has been irradiated onto a conventional amorphous silicon pattern.

Hereinafter, a preferred embodiment of the present invention will be described with reference to the accompanying drawings. In the following description and drawings, the same reference numerals are used to designate the same or similar components, so repetition of the description on the same or similar components will be omitted.

First, the technical principle of the present invention will be briefly described. According to the present invention, a-Si is deposited on a glass substrate, and then is patterned in the form of a TFT active pattern, thereby forming a crystallization pattern. After that, a laser is selectively irradiated onto the crystallization pattern, thereby crystallizing a-Si into poly-Si. In particular, a plurality of crystallization inducement patterns is formed in a predetermined internal portion of a-Si when pattering a-Si.

According to the present invention, the crystallization process is performed in a state in which a-Si has been patterned in the form of an active pattern, or in a state in which a plurality of crystallization inducement patterns are formed in the predetermined internal portion of a-Si, thereby forming poly-Si having large-size grains over the whole area of the crystallization pattern. In addition, it is possible to precisely control the position and number of the grain boundaries. Therefore, since the present invention can form poly-Si having large-size grains while precisely controlling the position and number of the grain boundaries, the TFT characteristics can be improved and uniformity of the TFT characteristics over the whole area of a substrate is also improved.

In addition, according to the present invention, when performing the crystallization process using the laser, the laser is irradiated onto the substrate after a-Si has been patterned in the form of an active pattern, so that the crystallization process can be simplified as compared with that of the prior art, in which the laser must be irradiated onto the entire surface of the substrate. In addition, although it will be described later, according to the present invention, laser irradiation is performed using a simple box type mask, which exposes the active pattern only, without using a mask having complicated slit patterns, so that the crystallization process can be further simplified.

Hereinafter, the present invention will be described in more detail. FIG. 1 is an SEM picture showing a fine crystallization structure of poly-Si obtained after the laser has been irradiated onto patterned a-Si.

As shown in FIG. 1, after the laser has been irradiated, crystallization of a-Si into poly-Si is realized from a peripheral portion of the a-Si pattern in a laser irradiation region through the lateral growth of a-Si as indicated by arrows. In addition, the crystallization of a-Si into poly-Si through the lateral growth of a-Si is completed at a fine grain region, which is formed on the pattern due to nucleation and growth.

Figure 2A:
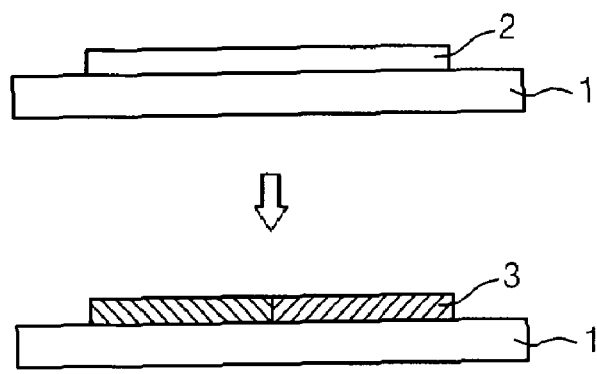
FIGS. 2A and 2B are sectional views for explaining the crystallization state of an amorphous silicon pattern according to the size of a crystallization pattern.
Figure 2B:
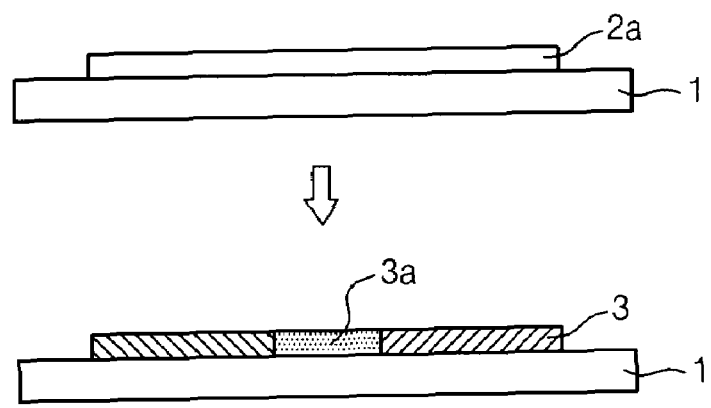

FIGS. 2A and 2B are sectional views for explaining the crystallization state of an a-Si pattern according to the size of a crystallization pattern. When the laser has an energy level, which is sufficiently high for melting a-Si, the crystallization state of the a-Si pattern is divided into two states depending on the size of the a-Si pattern.

First, as shown in FIG. 2A, if the size of an a-Si pattern 2 is identical to or less than the lateral growth length, a-Si is crystallized only through the lateral growth, so that poly-Si 3 having large-size grains can be formed.

At this time, since the lateral growth length is an effective length, as shown in FIG. 2B, if the size of an a-Si pattern 2a so large that the lateral growth length cannot cover the entire surface of the a-Si pattern 2, that is, if the size of the a-Si pattern 2a is larger than that of the critical lateral growth length, poly-Si is formed when melted Si is cooled after laser irradiation due to nucleation and growth of the fine grains. Accordingly, poly-Si 3 having large-size grains can be formed together with poly-Si 3a having small-size grains.

Figure 3A:
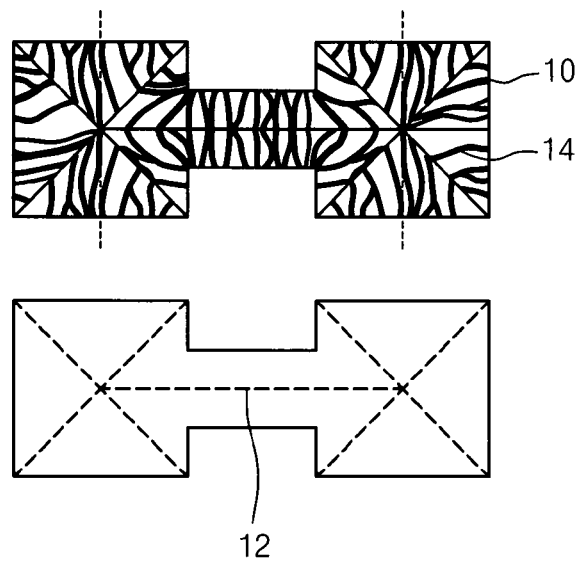
FIGS. 3A and 3B are plan views for explaining the crystallization state of an amorphous silicon pattern according to the size of a crystallization pattern.
Figure 3B:
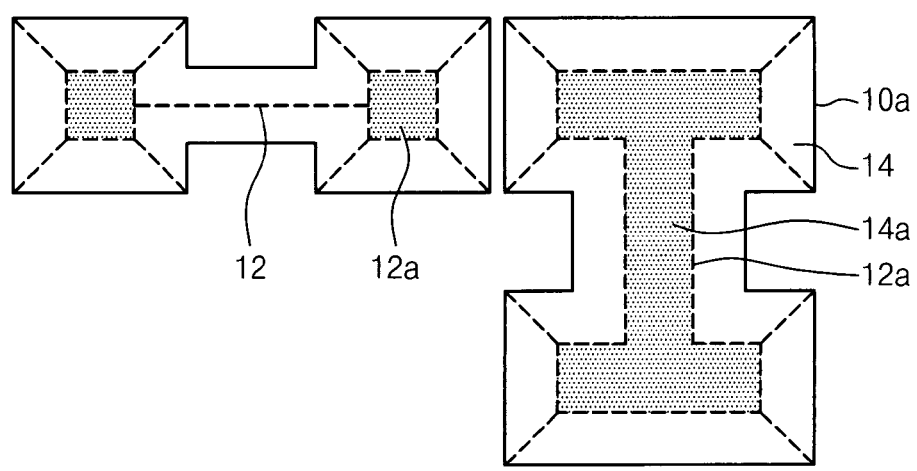

Hereinafter, the above crystallization state will be described with reference to an a-Si pattern having a dumbbell shape as shown in FIGS. 3A and 3B. FIGS. 3A and 3B are plan views for explaining the crystallization state of an a-Si pattern according to the size of a crystallization pattern.

As shown in FIG. 3A, if the size of an a-Si pattern 10 is smaller than the lateral growth length, poly-Si 14 including large-size grains is formed, without forming a fine grain region, through the lateral growth of a-Si from a peripheral portion of the pattern. At this time, protrusions 12 are formed in poly-Si 14 due to collision between grains, which have been grown during the lateral growth of a-Si.

In contrast, as shown in FIG. 3B, if the size of an a-Si pattern 10a is larger than the lateral growth length, grains formed through the lateral growth of a-Si and a fine grain region may exist together. Accordingly, protrusions 12 and 12a are formed in poly-Si 14, respectively, due to collision between poly-Si 14 having large-size grains, which have been grown from the peripheral portion of the pattern, and poly-Si 14a having small-size grains.

Meanwhile, the fine grains may degrade the poly-Si TFT characteristics, so it is not necessary to grow poly-Si having small-sized grains when crystallizing a-Si. However, if poly-Si is formed by crystallizing a-Si, which is patterned with various sizes and shapes, through the conventional crystallization process, it is difficult to prevent the fine grains from growing, so that there are limitations to obtain desired TFT characteristics.

For this reason, according to the present invention, prior to performing the crystallization process with respect to the a-Si pattern having various shapes and sizes larger than the critical lateral growth length, crystallization inducement patterns, such as hole patterns or dimple patterns, are inserted into a predetermined pattern region where the fine grain region is expected to be formed, thereby preventing the fine grain region from being formed. In this state, the crystallization process is performed with respect to the a-Si pattern.

If the hole pattern or the dimple pattern is inserted into the pattern region, the grains are grown from a peripheral portion of the hole pattern or the dimple pattern in the same way as the grains grown from the peripheral portion of the a-Si pattern. Accordingly, it is possible to form poly-Si having large-size grains over the whole area of the a-Si pattern without forming the fine grain region.

Figure 4:
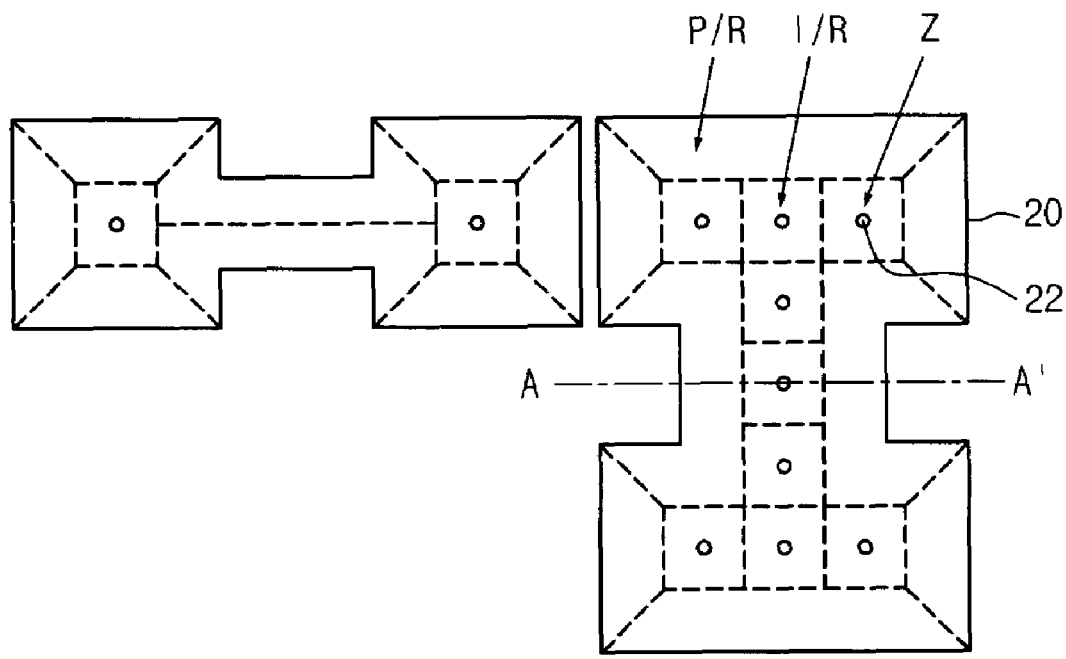
FIG. 4 is a plan view illustrating a crystallization pattern according to one embodiment of the present invention.
Figure 5:
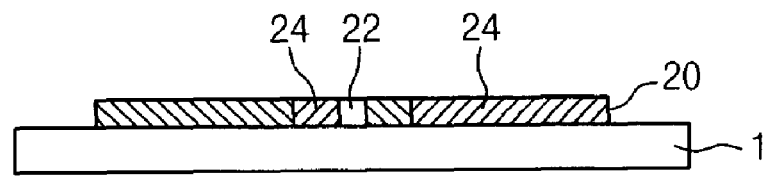
FIG. 5 is a sectional view taken along line A-A' shown in FIG. 4.

Hereinafter, the above process will be described in more detail with reference to FIGS. 4 and 5. FIG. 4 is a plan view illustrating the crystallization pattern according to one embodiment of the present invention, and FIG. 5 is a sectional view taken along line A-A' shown in FIG. 4. As shown in FIGS. 4 and 5, according to the present invention, the crystallization pattern 20 is prepared in order to form poly-Si having large-size grains by performing the crystallization process with respect to the a-Si pattern having various shapes and sizes larger than the critical lateral growth length.

The crystallization pattern 20 is made from a-Si, which is crystallized into poly-Si when the laser is irradiated thereon, and includes a peripheral region (P/R) located within a first distance from an edge of the pattern, in which the first distance corresponds to the critical lateral growth length, and an internal region (I/R) located away from the edge of the pattern by more than the first distance. In addition, the internal region is divided into at least one sub-region (Z), into which a crystallization inducement pattern 22 including a hole pattern or a dimple pattern is inserted. At this time, an edge of each sub-region is located within a second distance from the crystallization inducement pattern 22, in which the second distance is shorter than the first distance.

As the crystallization process is performed with respect to the above crystallization pattern 20, as shown in FIG. 5, the edge of the crystallization pattern 20. In addition, poly-Si 24 having large-size grains is also grown from the crystallization inducement pattern 22.

Thus, according to the present invention, the lateral growth simultaneously occurs from both the peripheral portion of the crystallization pattern 20 and the crystallization inducement pattern 22, so that it is possible to obtain poly-Si 24 free of a fine grain region, even if the lateral growth length is limited.

Therefore, the present invention can simply solve the problem derived from the fine grain region by additionally inserting the hole pattern or the dimple pattern in the pattern region, even if the a-Si pattern has a large size. Thus, the present invention does not limit the size of the a-Si pattern and can control the position of the grain boundary, that is the position of the protrusions, by adjusting the alignment of the hole pattern or the dimple pattern, so that TFT characteristics and uniformity of the TFT characteristics can be significantly improved.

Meanwhile, it is not necessary to perform an additional masking process or other additional processes when forming the crystallization pattern according to the present invention. That is, according to the present invention, a mask pattern is formed on a typical active mask in order to obtain the crystallization inducement pattern, and then, typical masking and etching processes are performed using the active mask in a state in which an a-Si film is formed on the glass substrate, thereby forming the crystallization pattern.

Figure 6:
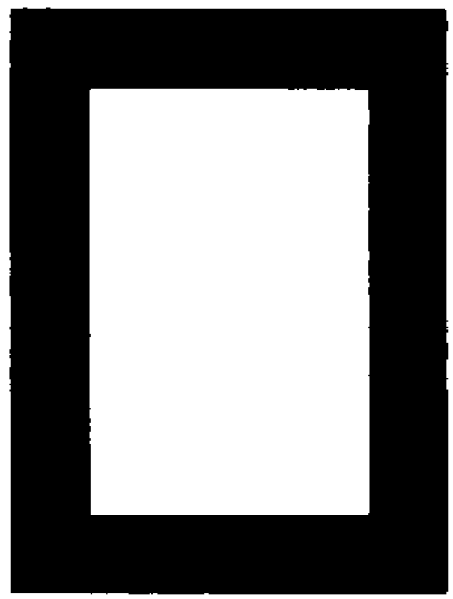
FIG. 6 is a view illustrating a mask used in a method for crystallizing amorphous silicon according to one embodiment of the present invention.

In addition, when performing the crystallization process with respect to the crystallization pattern according to the present invention, laser irradiation is carried out using a simple rectangular type mask 30 as shown in FIG. 6, instead of using a mask having complicated slit patterns.

The box type mask 30 is formed with an open region so as to allow the laser to be irradiated over the whole area of the crystallization pattern. Since the present invention performs the laser irradiation using the box type mask 30, the crystallization pattern made from a-Si can be crystallized through performing laser irradiation one time.

In particular, the above process can be realized by simply changing the mask pattern, without modifying or changing SLS equipment. The conventional SLS scheme requires at least two crystallization steps, that is, the laser must be irradiated by at least two times. However, according to the present invention, it is enough to irradiate the laser one time during the crystallization process, so that the present invention can improve productivity two times greater than that of the conventional SLS scheme. In addition, since the number of laser shots applied over the whole area of the glass substrate during the crystallization process is reduced by a half, the panel cost and equipment maintenance cost can be reduced by a half, theoretically.

Since the present invention performs the laser irradiation by using the simple box type mask, the present invention represents the process window relatively larger than that of the conventional SLS scheme using a complicated mask. In addition, different from the conventional SLS scheme, which requires the precise position control algorithm in order to control the position of protrusions formed in crystallized poly-Si, the present invention does not require the precise position control algorithm for the protrusions because the position of the protrusions can be precisely controlled by means of the a-Si pattern and the crystallization inducement pattern, such as the hole pattern or the dimple pattern.

As described above, according to the present invention, the crystallization inducement pattern is additionally inserted into a-Si when patterning a-Si in the form of the active pattern during the crystallization process for a-Si, so that a-Si is laterally grown from both the edge of the active pattern and the crystallization inducement pattern as the laser is irradiated onto a-Si, thereby forming poly-Si having large-size grains from a-Si having various shapes and sizes.

Since the present invention can form poly-Si having large-size grains while precisely and easily controlling the position of protrusions, the TFT characteristics can be improved and uniformity of the TFT characteristics over the whole area of the substrate is also improved.

In addition, different from the conventional SLS scheme, in which the laser must be irradiated by at least two times, the present invention can crystallize the a-Si pattern by irradiating the laser one time using the simple box type mask during the crystallization process for the a-Si pattern. Thus, the present invention can reduce the process steps by a half, so that the manufacturing cost and equipment maintenance cost can also be reduced by a half, while improving productivity.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A crystallization pattern including amorphous silicon film on a glass substrate, which is crystallized into polycrystalline silicon as a laser is irradiated thereto, the crystallization pattern comprising:
   at least one of: a hole and a dimple in the amorphous silicon film;
   a peripheral region located within a first distance from an edge of the crystallization pattern and including a first area of lateral growth; and
   an internal region located away from the edge of the crystallization pattern by more than the first distance, wherein
   the internal region is divided into at least one sub-region, each sub-region includes one crystallization inducement pattern,
   an edge of each sub-region is located within a second distance from the crystallization inducement pattern,
   and each sub-region includes a second area of lateral growth commencing at the crystallization inducement pattern;
   wherein the first area of lateral growth and the second area of lateral growth simultaneously exist.

2. A method for crystallizing amorphous silicon in order to fabricate a polycrystalline silicon thin film transistor, the method comprising the steps of:
   forming an amorphous silicon film on a glass substrate;
   forming a crystallization pattern comprised of at least one of a hole and a dimple in the amorphous silicon film by patterning the amorphous silicon film in a form of an active pattern of the thin film transistor; and
   crystallizing the crystallization pattern into polycrystalline silicon with lateral growth simultaneously from both a peripheral region and at least one crystallization inducement pattern by irradiating a laser onto the crystallization pattern, wherein
   the crystallization pattern includes the peripheral region located within a first distance from an edge of the crystallization pattern, and an internal region located away from the edge of the crystallization pattern by more than the first distance, the internal region is divided into at least one sub-region, each sub-region includes one crystallization inducement pattern, and an edge of each sub-region is located within a second distance from the crystallization inducement pattern.

3. The method as claimed in claim 2, wherein the laser is irradiated onto the crystallization pattern through an SLS (sequential lateral solidification) scheme.

4. The method as claimed in claim 3, wherein, when the laser is irradiated through the SLS scheme, a rectangular mask is used so as to expose an entire area of the crystallization pattern.

5. The method as claimed in claim 3, wherein laser irradiation is performed only one time by using the rectangular mask.

6. The method as claimed in claim 2, wherein the first distance corresponds to a critical lateral growth length.

7. The method as claimed in claim 2, wherein the second distance is identical to or shorter than the first distance.

8. The crystallization pattern as claimed in claim 1, wherein the first distance corresponds to a critical lateral growth length.

9. The crystallization pattern as claimed in claim 1, wherein the second distance is identical to or shorter than the first distance.

10. The crystallization pattern as claimed in claim 1, wherein the first distance is less than a critical lateral growth length at which crystal grains nucleated from sites other than from the edge of the crystallization pattern commence forming.

* * * * *